United States Patent
Lutz, Jr.

(10) Patent No.: US 6,297,958 B1
(45) Date of Patent: Oct. 2, 2001

(54) SYSTEM AND METHOD FOR HOUSING TELECOMMUNICATIONS EQUIPMENT

(75) Inventor: Ronald D. Lutz, Jr., Round Rock, TX (US)

(73) Assignee: General Bandwidth Inc., Austin, TX (US)

( * ) Notice: Subject to any disclaimer, the term of this patent is extended or adjusted under 35 U.S.C. 154(b) by 0 days.

(21) Appl. No.: 09/579,640

(22) Filed: May 26, 2000

(51) Int. Cl.$^7$ ....................................... H05H 7/20
(52) U.S. Cl. ..................... 361/690; 361/610; 361/688; 379/328; 174/52.1
(58) Field of Search ........................ 361/610, 688, 361/689–695, 721–727, 730–733, 778–785, 789–803, 825–829; 379/325–330, 332; 312/223.1, 265.3, 265.1, 265.4, 265.2, 265.6, 257.1, 236; 52/271; 211/26, 189, 194, 47, 50, 69.1; 454/184, 87; 165/80.3, 121–126, 104.33; 364/708.1; 174/52.1, 35 R, 35 MS, 37–38, 50

(56) References Cited

U.S. PATENT DOCUMENTS

| | | | |
|---|---|---|---|
| 2,340,727 | * 2/1944 | Zelt ....................................... | 175/361 |
| 4,293,891 | 10/1981 | Matsui et al. ....................... | 361/383 |
| 4,535,386 | 8/1985 | Frey, Jr. et al. ..................... | 361/389 |
| 4,536,824 | 8/1985 | Barrett et al. ....................... | 361/384 |
| 4,612,979 | 9/1986 | Heitzig .................................. | 165/129 |
| 4,774,631 | 9/1988 | Okuyama et al. ................... | 361/384 |
| 5,091,827 | 2/1992 | Suret et al. ........................... | 361/424 |
| 5,105,336 | 4/1992 | Jacoby et al. ........................ | 361/383 |
| 5,267,121 | 11/1993 | Uchida et al. ....................... | 361/694 |
| 5,281,026 | 1/1994 | Bartilson et al. .................... | 374/143 |
| 5,450,272 | * 9/1995 | Gaal et al. ............................ | 361/690 |
| 5,673,985 | * 10/1997 | Mitchell ............................ | 312/265.3 |
| 5,765,743 | 6/1998 | Sakiura et al. ...................... | 236/49.3 |
| 5,889,650 | * 3/1999 | Bertilsson et al. ................... | 361/690 |
| 5,894,407 | 4/1999 | Aakalu et al. ....................... | 361/695 |
| 6,053,808 | * 4/2000 | Koradia et al. ..................... | 454/184 |
| 6,100,468 | * 8/2000 | Niggl et al. ......................... | 174/52.1 |

FOREIGN PATENT DOCUMENTS

406013777A * 1/1994 (JP) ................................. H05K/7/20

* cited by examiner

Primary Examiner—Leo P. Picard
Assistant Examiner—Michael Datskovsky
(74) Attorney, Agent, or Firm—Baker Botts L.L.P.

(57) ABSTRACT

A system for housing telecommunications equipment includes a plurality of vertically disposed chassis, each chassis having a top that is substantially closed, two sides, two ends, and a base, wherein the top of each chassis is adapted to receive the base of an adjacent chassis. At least one vent is formed in each chassis adjacent the base for allowing air to enter the chassis, and at least one of the ends and one of the sides of the chassis are formed such that air may exit the chassis. The vent is disposed between the base and a portion of the chassis selected from the group consisting of either of the ends and either of the sides, and the vent is nonplanar in relation to that portion. More specifically, the chassis may be vertically disposed with substantially zero gap, and the vent member may be either an angled vent member or a notched vent member.

25 Claims, 2 Drawing Sheets

SYSTEM AND METHOD FOR HOUSING TELECOMMUNICATIONS EQUIPMENT

TECHNICAL FIELD OF THE INVENTION

This invention relates generally to the field of telecommunications and, more specifically, to a system and method for housing telecommunications equipment.

BACKGROUND OF THE INVENTION

Chassis are frameworks used to house telecommunications equipment, and are often found in a room or other area where, for example, switching takes place. This other room or area is often referred to as a "central office environment." When stacking chassis in a central office environment, important considerations include, among others, the proper cooling of each chassis, the efficient stacking of chassis to avoid wasted space, and meeting certain environmental requirements. The installer of telecommunication equipment has to be certain that lower chassis do not preheat upper chassis or that upper chassis do not block air flow from lower chassis. This was usually solved by perforating the tops and bottoms of chassis to obtain good vertical cooling. However, new network equipment-building standards ("NEBS") by Bell Atlantic and other RBOC companies discourage the design of complete vertical cooling because fire in lower chassis can easily pass through to upper chassis. Therefore, most chassis are now designed with substantially solid tops, and chassis are stacked in a rack with gaps or vent hoods between them. Usually, the gaps between chassis are 1.75"–3.5" (1.75" is referred to herein as one "rack unit"). And since space is at a premium when stacking and arranging telecommunication equipment, this wastes valuable space.

SUMMARY OF THE INVENTION

Since the challenges in the field of telecommunications continue to increase with demands for more and better techniques having greater flexibility and adaptability, a need has arisen for a new system and method for housing telecommunications equipment. In accordance with the present invention, a system and method for housing telecommunications equipment is provided that substantially eliminates or reduces disadvantages and problems associated with previously developed systems and methods.

A system for housing telecommunications equipment is disclosed. The system comprises a plurality of vertically disposed chassis housing the telecommunications equipment, each chassis having a top that is substantially closed, first and second ends, first and second sides, and a base, wherein the top of each chassis is adapted to receive the base of an adjacent chassis. At least one vent is formed in each chassis adjacent the base for allowing air to enter the chassis. The vent is disposed between the base and a portion of the chassis selected from the group consisting of either of the first end, the second end, the first side, and the second side, and the vent is nonplanar in relation to that portion. More specifically, the chassis may be vertically disposed with substantially zero gap, and the vent member may be either an angled vent member or a notched vent member.

A method for housing telecommunications equipment is disclosed. The method comprises two steps. Step one calls for vertically disposing a plurality of chassis, each chassis housing the telecommunications equipment and having a top that is substantially closed, first and second ends, first and second sides, and a base. The top of each chassis is adapted to receive the base of an adjacent chassis. Step two requires forming at least one vent in each chassis adjacent the base, wherein the vent is operable to allow air to enter the chassis. The vent is disposed between the base and a portion of the chassis selected from the group consisting of either of the first end, the second end, the first side, and the second side, and the vent is nonplanar in relation to that portion. More specifically, the chassis may be vertically disposed with substantially zero gap, and the vent member may be either an angled vent member or a notched vent member.

Embodiments of the invention provide numerous technical advantages. For example, a technical advantage of one embodiment is that valuable central office space can be saved by closely stacking chassis in a rack while still achieving desired cooling of the chassis. Since in one embodiment, vents in the chassis are either angled or notched, air can enter near the base of each chassis even though the chassis are closely stacked together. If only one chassis exists, this one chassis can be placed on a solid support, such as a floor or table, while still achieving the desired cooling.

Another technical advantage of an embodiment of the present invention is that the desired cooling of chassis, along with the desired close stacking of chassis, can be achieved in an manner that complies with new network equipment-building standards ("NEBS") fire-spreading criteria.

An additional technical advantage of an embodiment of the present invention is that a myriad of designs can be used for the vent depending upon what type of cooling is desired for a particular chassis arrangement.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EMBODIMENTS OF THE INVENTION

Embodiments of the present invention and its advantages are best understood by referring now to FIGS. 1A, 1B, 2A and 2B of the drawings, in which like numerals refer to like parts.

Figure 1A:
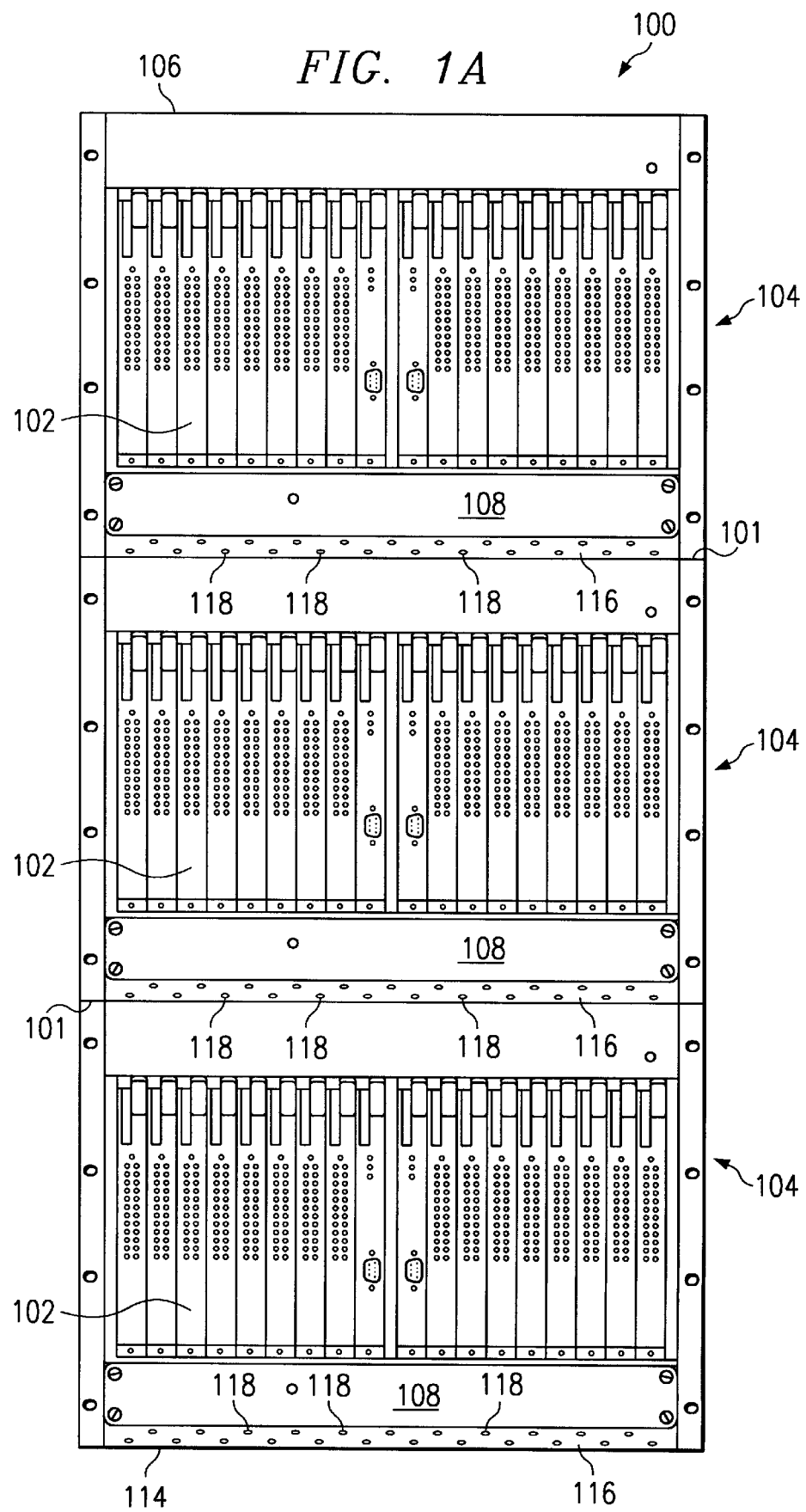
FIG. 1A is a front elevational view illustrating one system for housing telecommunications equipment useful in the practice of the present invention.
Figure 1B:
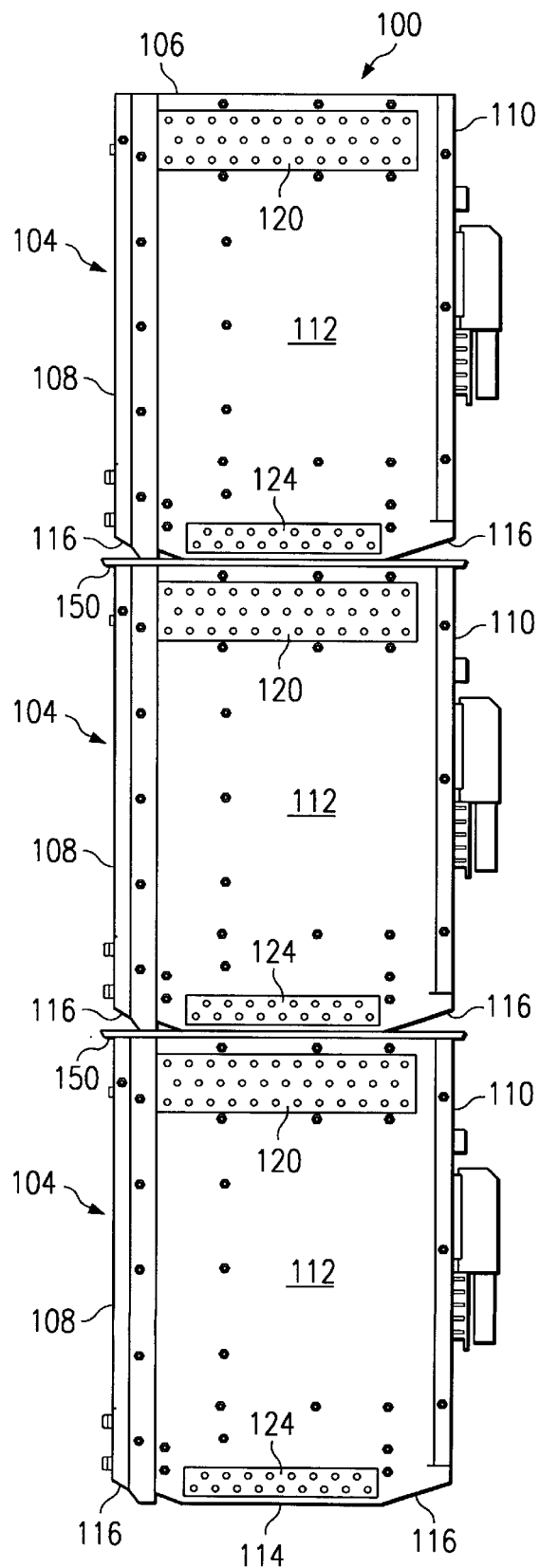
FIG. 1B is a side elevational view illustrating one system for housing telecommunications equipment useful in the practice of the present invention.

FIGS. 1A and 1B are front and side elevational views illustrating a system 100 for housing telecommunications equipment 102 in accordance with one embodiment of the present invention. Telecommunications equipment 102 may be any type of telecommunications equipment stored in a chassis; however, in this example, telecommunications equipment 102 is equipment utilized in a central office environment, or similar environment, such as an ATM switch or a DSLAM. In one embodiment, system 100 comprises a plurality of chassis 104 stacked in an equipment frame (not shown). In this example, telecommunications chassis 104 has a substantially solid top 106, first end 108, second end 110, first and second sides 112, and a base 114, and are made of a lightweight material such as steel, other metals such as aluminum, or other materials which are fire resistant; however, other configurations and materials may be used.

As shown best in FIG. 1B, chassis 104 comprises at least one vent 116 located adjacent base 114 for allowing air to enter chassis 104 via apertures 118 (FIG. 1A). Chassis 104 may also have at least one intake vent 124 (FIG. 1B) located on one or both sides 112 for allowing air to enter chassis 104; however, intake vent 124 is not required. Vent 116, which is described in detail below, allows air to enter the internal portion of chassis 104 to cool telecommunications equipment 102. Heated air inside chassis 104 exits via exhaust vents 120, as can be seen in FIG. 1B. In this embodiment, exhaust vents 120 are integral with either the sides 112, first end 108, or second end 110 of chassis 104; however, exhaust vents 120 may also be integral with top 106 of chassis 104, depending upon the type and configuration of telecommunications equipment 102 in chassis 104. Additionally, exhaust vents 120 may be attached to these components in a non-integral fashion. The air that enters chassis 104 through apertures 118 in vent 116 may be natural convection ambient air or may be forced air, such as air forced with a fan. Apertures 118 may be formed in any desired configuration, such as circular, hexagonal, oval or square, and in this example provide a total area of apertures sufficient to meet the cooling requirement for a particular heat load generated by telecommunications equipment 102 in chassis 104. In this example, the total area of apertures 118 in vent 116 is greater than the total area of apertures in exhaust vents 120. Vent 116 is adjacent base 114 of chassis 104 and may be configured as angled vent members as shown in FIG. 2A or notched vent members as shown in FIG. 2B.

Figure 2A:
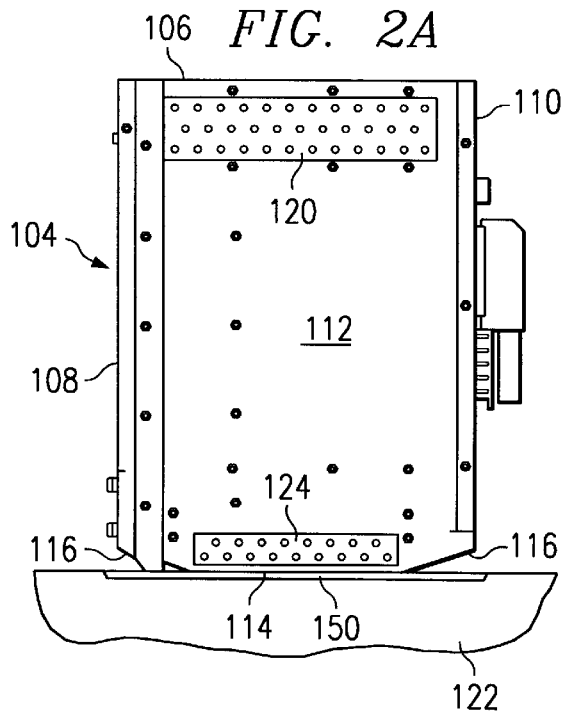
FIG. 2A illustrates one housing system having angled vent members and resting on a support.

FIG. 2A illustrates chassis 104 with angled vent members 116. Chassis 104 is shown in FIG. 2A to be supported by a support 122, which can be any type of support such as a floor, table, or other solid surface. Vents 116 are formed in chassis 104 such that vents 116 angle upward from an intermediate portion of base 114 and couple to either first end 108, second end 110, or side 112 of chassis 104. As can be seen in FIG. 2A, this results in a right triangle formed by angled vent member 116, the surface of support 122, and the imaginary vertical leg normal to the surface of support 122. This right triangle can be any desired configuration depending upon the type of cooling required for chassis 104. As described below, the "angling" of vent members 116 allows chassis 104 to be stacked upon one another with a gap less than 1.75 inches and down to 0.00 inches, while still obtaining the desired or required cooling. In addition, the smaller the gap, the greater the space that is saved. The angling of vent members 116 provide a further advantage in that more space is available inside chassis 104 for telecommunications equipment 102. An alternative arrangement for vent 116 of chassis 104 is to have notched vent members 116 as shown in FIG. 2B.

Figure 2B:
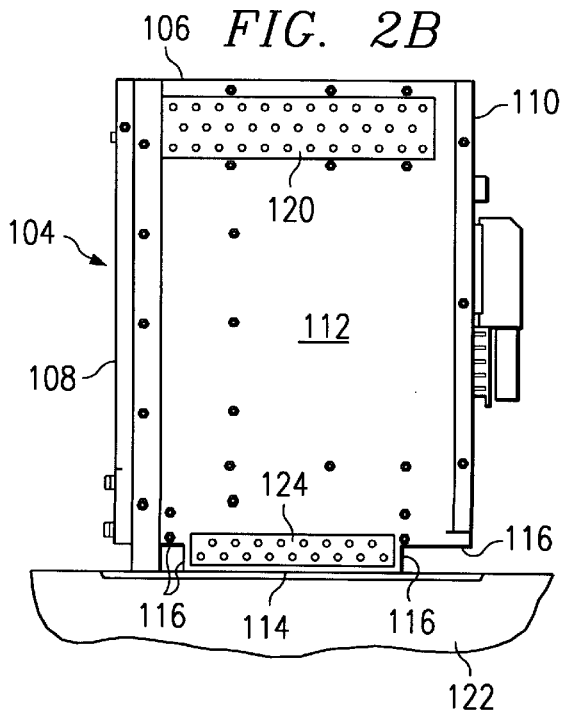
FIG. 2B illustrates another housing system having notched vent members and resting on a support.

FIG. 2B illustrates chassis 104 with notched vent members 116. As in FIG. 2A, FIG. 2B shows chassis 104 resting on support 122. Notched vent members 116 have two or more venting surfaces arranged in any desired configuration. For example, notched vent members 116 may have two venting surfaces that form an angle of 90° as shown in FIG. 2B, or may have two or more venting surfaces that form angles greater than, or less than, 90°. In any configuration, the total area of apertures 118 in vents 116 may be designed based on how much cooling is required for a particular heat load generated by telecommunications equipment 102 inside chassis 104. As described below, the "notching" of vent members 116 allows chassis 104 to be stacked upon one another with a gap less than 1.75 inches and down to 0.00 inches, while still obtaining the desired or required cooling. In addition, the smaller the gap, the greater the space that is saved. The notching of vent members 116 provide a further advantage in that more space is available inside chassis 104 for telecommunications equipment 102.

As can be seen in either FIG. 2A or FIG. 2B, chassis 104 rests on support 122 with substantially no gap in between. Vents 116 facilitate this by allowing air to enter chassis 104 while chassis 104 rests on support 122, or rests upon another chassis 104 as shown in FIGS. 1A and 1B. This direct stacking upon either support 122 or another chassis 104 is desirable because it saves valuable space, which is at a premium in, for example, central office environments. The present invention reduces to zero, in some embodiments, the gap between chassis stacked on top of each other, such as chassis 104. In conventional systems, a gap of 1.75" to 3.5" (one to two rack units) between adjacent chassis is maintained because these gaps are the minimum required to provide the required cooling. Gaps less than 1.75" facilitate preheating of upper chassis and may result in violations of industry standards. Vents 116 are also shown in FIG. 2A and FIG. 2B to be located at the lower edge of either first end 108 or second end 110. However, vents 116 may also be located on one or both sides 112 of chassis 104.

In operation, a plurality of chassis 104 are stacked in an equipment frame 101 as shown in FIG. 1A. FIGS. 1B, 2A, and 2B show the stacking of the plurality of chassis 104 without equipment frame 101. At least one vent 116 is formed in each chassis 104 to allow air to enter the chassis 104 to cool telecommunications equipment 102 contained in chassis 104. Chassis 104 is stacked upon one another in the frame 101 with a gap 150 less than 1.75 inches, and may be stacked with a substantially zero gap. As mentioned previously, the smaller the gap, the greater the space saved. Either natural convection ambient air or forced air enters vents 116 to cool telecommunications equipment 102 and chassis 104, and the heated air exits exhaust vents 120, which are contained in this embodiment in either sides 112, first end 108, second end 110, or top 106. Alternatively, if a single chassis 104 is used, such as shown in FIG. 2A or 2B, then chassis 104 is normally placed upon support 122 with a substantially zero gap 150 between base 114 and support 122. In this case, vents 116 allow air to enter chassis 104 to cool telecommunications equipment 102. Heated air exits exhaust vents 120 as described above.

Although an embodiment of the invention and its advantages are described in detail, a person skilled in the art could make various alternations, additions, and omissions without departing from the spirit and scope of the present invention as defined by the appended claims.

What is claimed is:

1. A system for housing telecommunications equipment, comprising:

a plurality of vertically disposed chassis housing the telecommunications equipment, each chassis having a top that is substantially closed, first and second sides, first and second ends, and a base, wherein the top of each chassis is adapted to receive the base of an adjacent chassis;

at least one vent formed in each chassis adjacent the base, wherein the vent is operable to allow air to enter the chassis; and wherein the vent is disposed between the base and a portion of the chassis selected from the group consisting of the first side, the second side, the first end, and the second end, and wherein the rent is nonplanar in relation to the portion, wherein the vent is a notched vent member coupled to the base and the portion, wherein the notched vent member has two or more venting surfaces.

2. The system of claim 1, wherein at least one set of adjacent chassis in the plurality of vertically disposed chassis are separated by a gap that is less than 1.75 inches.

3. The system of claim 1, wherein at least one set of adjacent chassis are stacked such that the top of a first chassis is in direct contact with the base of a second chassis with no gap therebetween apart from the vent of the second chassis.

4. The system of claim 1, wherein the vent has a plurality of apertures.

5. The system of claim 1, wherein the two or more venting surfaces angle toward the portion.

6. The system of claim 1, wherein the notched vent member coupled to the base and the portion has two venting surfaces forming a ninety degree angle.

7. A system for housing telecommunications equipment, comprising:
a chassis housing the telecommunications equipment and having a top that is substantially closed, first and second sides, first and second ends, and a base;
at least one vent formed in the chassis adjacent the base, wherein the vent is operable to allow air to enter the chassis; and
wherein the vent is disposed between the base and a portion of the chassis selected from the group consisting of the first side, the second side, the first end, and the second end, and wherein the vent is nonplanar in relation to the portion, wherein the vent is a notched vent member coupled to the base and the portion, wherein the notched vent member has two or more venting surfaces.

8. The system of claim 7 further comprising:
a support underneath the base of the chassis, wherein the support is operable to support the chassis.

9. The system of claim 8, wherein the chassis and the support are separated by a gap that is less than 1.75 inches exists.

10. The system of claim 8, wherein the chassis and the support have no gap therebetween apart from the vent.

11. The system of claim 7, wherein the vent has a plurality of apertures.

12. The system of claim 7, wherein the two or more venting surfaces angle toward the portion.

13. The system of claim 7, wherein the notched vent member coupled to the base and the portion includes two venting surfaces forming a ninety degree angle.

14. A method for housing telecommunications equipment, the method comprising:
vertically disposing a plurality of chassis, each chassis housing the telecommunications equipment and having a top that is substantially closed, first and second sides, first and second ends, and a base, wherein the top of each chassis is adapted to receive the base of an adjacent chassis; and
forming at least one vent in each chassis adjacent the base, wherein the vent is operable to allow air to enter the chassis, and wherein the vent is disposed between the base and a portion of the chassis selected from the group consisting of the first side, the second side, the first end, and the second end, and wherein the vent is nonplanar in relation to the portion, wherein the vent is a notched vent member coupled to the base and the portion, wherein the notched vent member has two or more venting surfaces.

15. The method of claim 14, wherein vertically disposing a plurality of chassis comprises separating at least one set of adjacent chassis by a gap that is less than 1.75 inches.

16. The method of claim 14, wherein vertically disposing a plurality of chassis comprises stacking at least one set of adjacent chassis such that there is no gap therebetween apart from the vent.

17. The method of claim 14, further comprising:
providing the vent with a plurality of apertures.

18. The method of claim 14, wherein the two or more venting surfaces angle toward the portion.

19. The method of claim 14, wherein the notched vent member coupled to the base and the portion includes two venting surfaces forming a ninety degree angle.

20. A system for housing telecommunications equipment, comprising:
a plurality of vertically disposed chassis, each chassis housing the telecommunications equipment and having a top substantially closed, first and second sides, first and second ends, and a base, wherein the top of each chassis is adapted to receive the base of an adjacent chassis;
a first vent formed in each chassis and having a lower end and an upper end, the lower end coupled to the base and the upper end coupled to the first end of the chassis such that the front vent is nonplanar in relation to the first end;
a second vent formed in each chassis and having a lower end and an upper end, the lower end coupled to the base and the upper end coupled to the second end of the chassis such that the rear vent is nonplanar in relation to the second end; and wherein the first and second vents are operable to allow air to enter the chassis, wherein the first and second vents are notched vent members coupled to the base and the respective first and second ends, wherein the notched vent member has two or more venting surfaces.

21. The system of claim 20, wherein at least one set of adjacent chassis in the plurality of vertically disposed chassis are separated by a gap that is less than 1.75 inches.

22. The system of claim 20, wherein at least one set of adjacent chassis in the plurality of vertically disposed chassis are stacked such that the top of a first chassis is in direct contact with the base of a second chassis with no gap therebetween apart from the first and second vents of the second chassis.

23. The system of claim 20, wherein the first and second vents each have a plurality of apertures.

24. The system of claim 20, wherein the two or more venting surfaces angle toward the base.

25. The system of claim 20, wherein the notched vent members coupled to the base include two venting surfaces forming a ninety degree angle.

* * * * *